(12) United States Patent
Hsiao et al.

(10) Patent No.: US 11,443,981 B2
(45) Date of Patent: Sep. 13, 2022

(54) BONDING METHOD OF PACKAGE COMPONENTS AND BONDING APPARATUS

(71) Applicant: Taiwan Semiconductor Manufacturing Co., Ltd., Hsinchu (TW)

(72) Inventors: Yi-Li Hsiao, Hsinchu (TW); Chih-Hang Tung, Hsinchu (TW); Chen-Hua Yu, Hsinchu (TW); Tung-Liang Shao, Hsinchu (TW); Su-Chun Yang, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/866,565

(22) Filed: May 5, 2020

(65) Prior Publication Data
US 2021/0050251 A1 Feb. 18, 2021

Related U.S. Application Data

(60) Provisional application No. 62/887,670, filed on Aug. 16, 2019.

(51) Int. Cl.
*H01L 21/768* (2006.01)
*H01L 21/50* (2006.01)
*H01L 21/60* (2006.01)

(52) U.S. Cl.
CPC ........ *H01L 21/76828* (2013.01); *H01L 21/50* (2013.01); *H01L 2021/60127* (2013.01)

(58) Field of Classification Search
None
See application file for complete search history.

(56) References Cited

U.S. PATENT DOCUMENTS

| 6,229,124 | B1* | 5/2001 | Trucco | B23K 1/002 |
| | | | | 219/605 |
| 6,902,987 | B1* | 6/2005 | Tong | H01L 25/0657 |
| | | | | 438/455 |
| 7,332,411 | B2* | 2/2008 | McKinnell | H01L 24/29 |
| | | | | 257/E23.008 |
| 8,993,380 | B2 | 3/2015 | Hou et al. | |
| 9,281,254 | B2 | 3/2016 | Yu et al. | |
| 9,299,649 | B2 | 3/2016 | Chiu et al. | |

(Continued)

*Primary Examiner* — Benjamin P Sandvik
(74) *Attorney, Agent, or Firm* — JCIPRNET

(57) ABSTRACT

A bonding method of package components and a bonding apparatus are provided. The method includes: providing at least one first package component and a second package component, wherein the at least one first package component has first electrical connectors and a first dielectric layer at a bonding surface of the at least one first package component, and the second package component has second electrical connectors and a second dielectric layer at a bonding surface of the second package component; bringing the at least one first package component and the second package component in contact, such that the first electrical connectors approximate or contact the second electrical connectors; and selectively heating the first electrical connectors and the second electrical connectors by electromagnetic induction, in order to bond the first electrical connectors with the second electrical connectors.

20 Claims, 11 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 * | 8/2017 | Su et al. | |
| 2007/0224839 A1 * | 9/2007 | Shimizu | H05B 6/806 438/795 |
| 2009/0188704 A1 * | 7/2009 | Lee | H01L 23/49816 174/255 |
| 2011/0248024 A1 * | 10/2011 | Yonenaga | H01L 21/67303 219/634 |
| 2012/0266461 A1 * | 10/2012 | Nickut | B23K 26/361 29/840 |
| 2015/0340285 A1 * | 11/2015 | Enquist | H01L 24/82 438/107 |
| 2016/0141264 A1 * | 5/2016 | Nah | B23K 1/0016 219/616 |
| 2017/0062366 A1 * | 3/2017 | Enquist | H01L 24/03 |

* cited by examiner

BONDING METHOD OF PACKAGE COMPONENTS AND BONDING APPARATUS

CROSS-REFERENCE TO RELATED APPLICATION

This application claims the priority benefit of U.S. provisional application Ser. No. 62/887,670, filed on Aug. 16, 2019. The entirety of the above-mentioned patent application is hereby incorporated by reference herein and made a part of this specification.

BACKGROUND

Three dimensional integrated circuit (3D IC) is emerging as a new scheme for IC fabrication and system integration, to combine mixed technologies for achieving high density integration with small form factor, high performance and low power consumption. In addition, 3D IC is a promising solution to extend and get beyond the Moore's law. To attain a 3D integration structure, chip to chip (C2C) bonding, chip to wafer (C2W) bonding, wafer to wafer (W2 W) bonding, package to substrate bonding or the like is often required for realizing vertical interconnection. However, such bonding often requires high temperature thermal treatment, which may result in thermal damages on electronic devices formed in the bonded structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
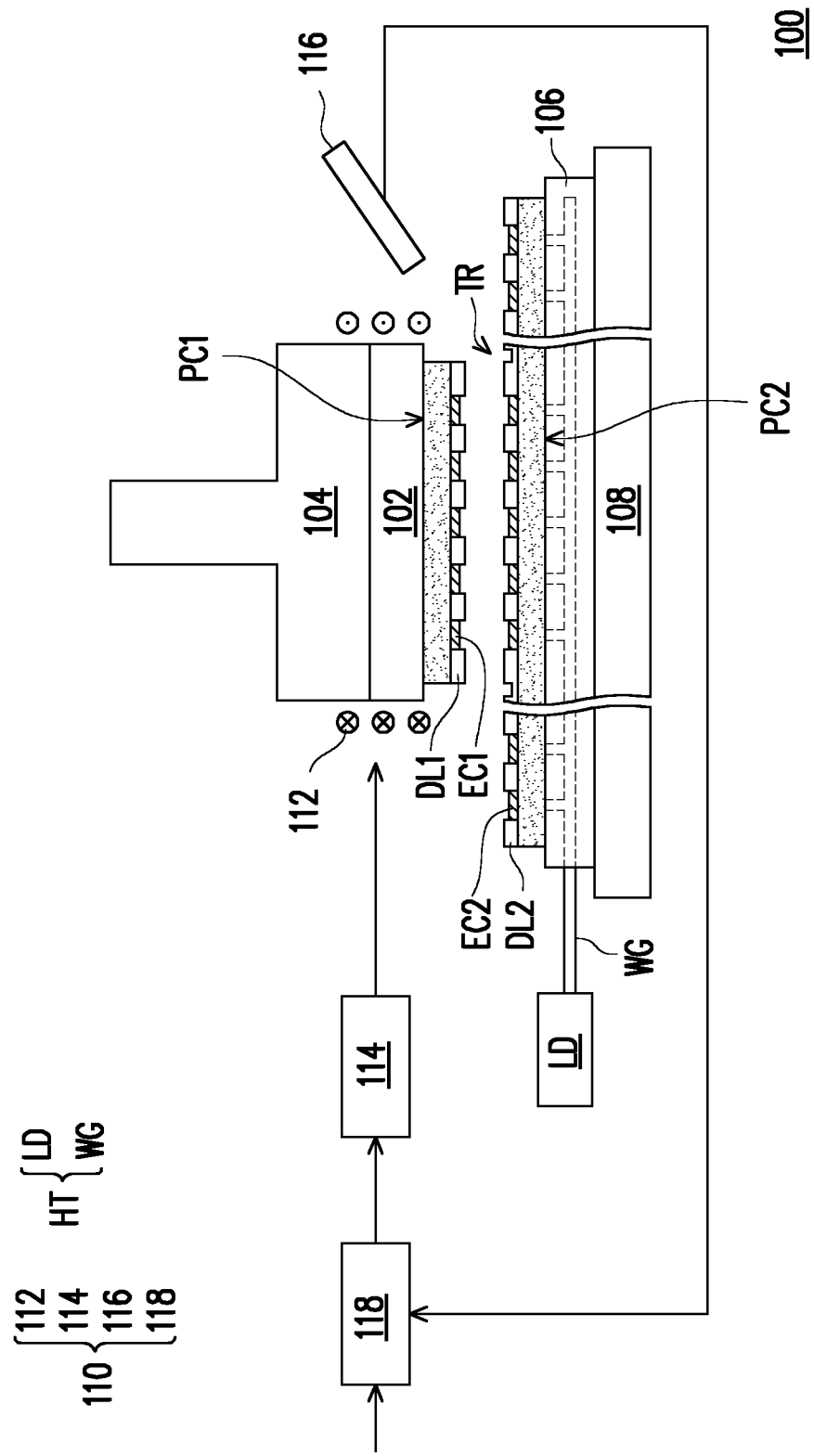
FIG. 1A is a schematic diagram illustrating a bonding apparatus according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

The present disclosure relates to a method including bonding package components by an induction heating manner. The bonding method can be realized by various bonding apparatuses to be described with the following embodiments, and process steps of the bonding method may have different sequential orders.

FIG. 1A is a schematic diagram illustrating a bonding apparatus 100 according to some embodiments of the present disclosure.

Referring to FIG. 1A, in some embodiments, the bonding apparatus 100 can be used for a chip to wafer (C2W) bonding process. During the bonding process, electrical connectors at a bonding surface of a first package component PC1 (e.g., a semiconductor chip) are bonded to electrical connectors at a bonding surface of a second package component PC2 (e.g., a device wafer or an interposer wafer). The bonding apparatus 100 is configured to selectively heat the electrical connectors by an electromagnetic induction manner while bonding the electrical connectors. In this way, thermal damages on electronic devices (e.g., interconnection structures and/or active devices) formed inside the first package component PC1 and/or the second package component PC2 can be significantly reduced during the bonding process. For instance, elements in the first and second package components PC1, PC2 except for the electrical connectors can be kept at a relative low temperature about 200° C. In some embodiments, the bonding apparatus 100 is used in a hybrid bonding process. In these embodiments, dielectric layers from the package components are bonded together along with the bonding of the electrical connectors.

In some embodiments, the first package component PC1 is a semiconductor chip. For instance, the semiconductor chip may be a logic chip, a memory chip, a sensor chip, a digital chip, an analog chip, a wireless and radio frequency chip, a voltage regulator chip, an application-specific integrated chip (ASIC) or any other type of semiconductor chip. The semiconductor chip has an active side at which a plurality of active devices (not shown, such as transistors) are formed, and has a back side opposite to the active side. In some embodiments, the semiconductor chip is bonded to another package component (e.g., the device wafer or the interposer wafer to be described in the following paragraph) via its active side. In these embodiments, a plurality of electrical connectors (e.g., conductive pads) EC1 and a dielectric layer DL1 may be located at the active side of the semiconductor chip. The electrical connectors EC1 are laterally surrounded by the dielectric layer DL1, and may be electrically connected to the active devices via interconnection structures (not shown) formed between the active devices and the electrical connectors EC1. Alternatively, the semiconductor chip is bonded to another package component by its back side, and the electrical connectors EC1 and the dielectric layer DL1 are disposed at the back side of the semiconductor chip. In these alternative embodiments, the electrical connectors EC1 may be electrically connected to the active devices by, for example, through substrate vias (TSVs) and interconnection structures (both not shown). Exposed surfaces of the electrical connectors EC1 and the dielectric layer DL1 may be collectively referred as a bonding surface of the first package component PC1. In some embodiments, the electrical connectors EC1 are slightly recessed from the exposed surface of the dielectric layer DL1, and may expand during a hybrid bonding process to have a thickness substantially equal to a thickness of the dielectric layer DL1. In alternative embodiments, exposed surfaces of the electrical connectors EC1 are substantially coplanar with or protruded from the exposed surface of the dielectric layer DL1 before performing a hybrid bonding process. A material of the electrical connectors EC1 may include Cu, Al, Ti, Ni, Sn, the like or combinations thereof, and a method for forming the electrical connectors EC1 may include a physical vapor deposition (PVD) process, a plating process (e.g., an electroplating process or an electroless plating process) or a combination thereof. In addition, a material of the dielectric layer DL1 may include a polymer material (e.g., epoxy, polybenzoxazole (PBO), benzocyclobutene (BCB)), silicon oxide, silicon nitride, silicon oxynitiride, the like or combinations thereof, and a method for forming the dielectric layer DL1 may include a chemical vapor deposition (CVD) process, a solution process (e.g., a spin coating process) or the like. In those embodiments where the electrical connectors EC1 are slightly recessed from the exposed surface of the dielectric layer DL1, an etching back process may be used to recess the electrical connectors EC1.

On the other hand, in some embodiments, the second package component PC2 is a device wafer. The device wafer has a plurality of die regions, which could be singulated from the device wafer to form semiconductor chips as respectively similar to the semiconductor chip described above, or could remain unsingulated in the device wafer. In these embodiments, the package component PC2 has a size much greater than a size of the semiconductor chip. As similar to the semiconductor chip described above, the device wafer also has an active side at which a plurality of active devices (not shown, such as transistors) are formed, and has a back side opposite to the active side. In some embodiments, the device wafer is bonded to the first package component PC1 via its active side. In these embodiments, a plurality of electrical connectors (e.g., conductive pads) EC2 and a dielectric layer DL2 are located at the active side of the device wafer. The electrical connectors EC2 are laterally surrounded by the dielectric layer DL2, and may be electrically connected to the active devices via interconnection structures (not shown) formed between the active devices and the electrical connectors EC2. In addition, a trench TR may be formed at a top surface of the dielectric layer DL2 for defining the die regions in the second package component PC2. In alternative embodiments, the device wafer is bonded to the first package component PC1 via its back side, and the electrical connectors EC2 and the dielectric layer DL2 are disposed at the back side of the device wafer. In these alternative embodiments, the electrical connectors EC2 may be electrically connected to the active devices by, for example, through substrate vias (TSVs) and interconnection structures (both not shown). Exposed surfaces of the electrical connectors EC2 and the dielectric layer DL2 may be collectively referred as a bonding surface of the second package component PC2. In addition, at least some electrical connectors EC2 of the second package component PC2 (e.g., the electrical connectors EC2 in one of the die regions) would be bonded to the electrical connectors EC1 of the first package component PC1. Configurations, materials and formation methods of the electrical connectors EC2 and the dielectric layer DL2 are as described in regarding the electrical connectors EC1 and the dielectric layer DL1 of the semiconductor chip, and would not be repeated again.

In other embodiments, the second package component PC2 is an interposer wafer. In other words, the first package component PC1 may be bonded to the interposer wafer, rather than being bonded to the device wafer as described above. The interposer wafer is sandwiched between package components (e.g., the semiconductor chip as described above and a package substrate (not shown)) in a finalized package structure, and configured to interconnect these vertically separated package components. In these embodiments, the interposer wafer also has the electrical connectors EC2 and the dielectric layer DL2 at its bonding surface. The electrical connectors EC2 are electrically connected to interconnection structures and/or through substrate vias (both not shown) formed in the interposer wafer. In addition, the interposer wafer may be free of active devices (e.g., transistors), and may not have the die regions as described above.

In some embodiments, the bonding apparatus 100 includes a first holder 102. The first holder 102 is configured to hold the first package component PC1, and be controlled for placing the first package component PC1 onto the second package component PC2 by a controller (e.g., a robotic arm). The first holder 102 is in contact with a side of the first package component PC1 that is facing away from the bonding surface. In those embodiments where the electrical connectors EC1 and the dielectric layer DL1 are disposed at the active side of the first package component PC1, the first holder 102 is in contact with the back side of the first package component PC1. Alternatively, the electrical connectors EC1 and the dielectric layer DL1 are disposed at the back side of the first package component PC1, and the first holder 102 is in contact with the active side of the first package component PC1. In some embodiments, the first holder 102 is a mechanical holder, rather than an electrical holder (e.g., an electrostatic chuck). In addition, the first holder 102 may be made of an insulating material, such as a ceramic material or a glass material. For instance, the first holder 102 may be a vacuum chuck, which is electrically insulating, and configured to hold the first package component PC1 by utilizing a pressure difference between an internal pressure of the vacuum chuck and a pressure outside the vacuum chuck. In those embodiments where the first holder PC1 is a vacuum chuck, vacuum channels (not shown) may be formed in the first holder PC1 and/or at a surface of the first holder PC1, and a vacuum pump (not shown) may be connected to the vacuum channels. By using the insulating mechanical holder rather than the electrical holder, undesired absorption of induction power by electrical elements in the electrical holder can be avoided. Therefore, efficiency of the induction heating can be improved. Even though the depicted first holder 102 only holds a single first package component PC1, the first holder 102 can be configured to hold a plurality of first package components PC1 in certain cases, in order to perform a mass transfer of the first package components PC1. Those skilled in the art may adjust dimensions and design of the first holder 102 according to transfer amount of the first holder 102, the present disclosure is not limited thereto.

In those embodiments where the first package component PC1 is bonded with the second package component PC2 via a hybrid bonding manner, the electrical connectors EC1, EC2 may be slightly recessed from the surrounding dielectric layers DL1, DL2, and the electrical connectors EC1, EC2 may not be in contact with each other when the dielectric layers DL1, DL2 are brought in contact. During a subsequent induction heating process, the electrical connectors EC1, EC2 may expand, and establish physical contact with each other. In alternative embodiments where the electrical connectors EC1, EC2 are not recessed from the surrounding dielectric layers DL1, DL2, the electrical connectors EC1, EC2 are in contact with each other when the first and second package components PC1, PC2 are brought in contact. Furthermore, in some embodiments, the first package component PC1 is further pressed against the second package component PC2 by using a bonding head 104 disposed over the first holder 102.

As similar to the first package component PC1, the second package component PC2 may be held by a second holder 106. The second holder 106 is in contact with a side of the second package component PC2 that is facing away from the bonding surface. That is, in those embodiments where the electrical connectors EC2 and the dielectric layer DL2 are disposed at the active side of the second package component PC2, the second holder 106 is in contact with the back side of the second package component PC2. Alternatively, when the electrical connectors EC2 and the dielectric layer DL2 are disposed at the back side of the second package component PC2, the second holder 106 is in contact with the active side of the second package component PC2. In some embodiments, the second holder 106 is as well an insulating mechanical holder, rather than an electrical holder. For instance, the second holder 106 may be the vacuum chuck as described above. Moreover, in some embodiments, the second holder 106 is disposed on a stage 108. The stage 108 is configured to support the second holder 106 and the second package component PC2 held by the second holder 106. In some embodiments, the stage 108 is made of an insulating material (e.g., a ceramic material or a glass material), so as to avoid undesired absorption of induction power.

The bonding apparatus 100 further includes an induction heating system 110. The induction heating system 110 is configured to selectively heat at least some of the electrical connectors EC1, EC2 when the first and second package components PC1, PC2 are brought in contact, so as to bond these electrical connectors EC1, EC2 together. In some embodiments, the induction heating system 110 includes an induction coil 112. The induction coil 112 is made of an electrically conductive material, such as Cu, or Cu alloy. Alternating current (AC) is provided to the induction coil 112, and a magnetic field is correspondingly produced in the heating targets (e.g., the electrical connectors EC1, EC2) surrounded by or in the vicinity of the induction coil 112. As such, eddy currents are induced in the heating targets, and heat is produced as the eddy currents flow against the resistivity of the heating targets. In some embodiments, the induction coil 112 is wound around the first holder 102. Those skilled in the art may adjust a number of windings and a number of layer(s) of the induction coil 112 according to process requirements, the present disclosure is not limited thereto. In some embodiments, the induction coil 112 may extend downwardly to cover at least a portion of a sidewall of the first package component PC1 held by the first holder 102, and/or extend upwardly to cover at least a portion of a sidewall of the bonding head 104. In addition, the induction coil 112 may be movable along a vertical direction, and can be controlled by a controller (e.g., an actuator). Elements surrounded by or in the vicinity of the induction coil 112 may be exposed to the magnetic field produced in correspondence to the alternating current, but the eddy current may only be induced in some of the elements that are electrically conductive and having dimensions in a certain range. In other words, other elements that are electrically insulating or having dimensions out of the above-mentioned certain range may not be heated. Such dimension range is dependent on frequency of the alternating current. More particularly, such dimension range is related to a skin depth of the eddy current that is dependent on the frequency of the alternating current. At a given frequency of the alternating current, elements larger than a critical dimension of several times of the corresponding skin depth (e.g., greater than 2-4 times of the skin depth) could be heated, whereas other elements smaller than the critical dimension may not be heated. In addition, as the frequency of the alternating current increases, the skin depth of the eddy current decreases. Accordingly, the higher the frequency of the alternating current, the target elements with smaller size could be heated. Therefore, by adjusting dimensions of the heating targets (e.g., at least some of the electrical connectors EC1, EC2) or the frequency of the alternating current, the heating targets (e.g., at least some of the electrical connectors EC1, EC2) can be selectively heated without damaging other conductive elements smaller than the critical dimension. For instance, the electrical connectors EC1, EC2 may respectively have dimensions (width, length and thickness) each ranging from 0.1 μm to 250 μm when the frequency of the alternating current ranges from 300 kHz to 300 GHz. On the other hand, the interconnection structures and elements in the active devices (e.g., gate structures) formed within the first and second package components PC1, PC2 may respectively have dimensions smaller than the dimensions of the electrical connectors EC1, EC2, thus can be avoided from being heated.

In some embodiments, the induction heating system 110 further includes a controller 114, a temperature sensor 116 and a comparator 118. The controller 114 is configured to provide the alternating current to the induction coil 112. In some embodiments, the alternating current is provided to the induction coil 112 as pulses. In these embodiments, the heating targets (e.g., at least some of the electrical connectors EC1, EC2) can be heated intermittently, rather than being heated continuously. As such, overheating of these heating targets (e.g., at least some of the electrical connectors EC1, EC2) can be avoided, and the thermal energy conducted from the heating targets to surrounding elements can be reduced. The temperature sensor 116 is configured to detect a temperature of the heating targets (e.g., at least some of the electrical connectors EC1, EC2) and/or other elements in the first and second package components PC1, PC2. In some embodiments, the temperature sensor 116 is a non-contact temperature sensor (e.g., an infrared temperature sensor), and can be placed outside the induction coil 112. In this way, the temperature sensor 116 may be avoided from being interfered by the magnetic field produced by the induction coil 112. The comparator 118 is configured to compare the detection result of the temperature sensor 116 and a pre-determined temperature value, and the controller 114 is configured to adjust the alternating current provided to the induction coil 112 according to the comparison result. In this way, the alternating current provided to the induction coil 112 can be dynamically adjusted, thus the induction heating process can be optimized.

In some embodiments where the induction heating system 110 is configured to perform a hybrid bonding process, the first and second package components PC1, PC2 may be heated through the first and second holders 102, 106, such that the dielectric layers DL1, DL2 can be bonded together. On the other hand, the electrical connectors EC1, EC2 of the first and second package components PC1, PC2 are bonded together by using the induction heating system 110. In some embodiments, the whole first and second package components PC1, PC2 are heated during heating of the first and second dielectric layers DL1, DL2. In other words, the heating treatment performed on the first dielectric layers DL1, DL2 may be a non-selective heating treatment. A heater HT may be connected to the first and second holders 102, 106. For conciseness, only the second holder 106 is depicted as connecting to the heater HT. In some embodiments, the heater HT includes a laser device LD and a wave guide WG. The wave guide WG is connected to the laser device LD, and extending into the first and second holders 102, 106 (a portion of the wave guide WG extending in the first holder 102 and connecting to the laser device LD is omitted from illustration). In this way, the first and second package components PC1, PC2 may be non-selectively heated by absorbing light (e.g., laser light) generated by the laser device LD and transmitted through the wave guide WG. The first and second holders 102, 106 may be connected to the same laser device LD, or respectively connected to a laser devices LD. In other embodiments, the laser device LD may be replaced by an air heater, and the wave guide WG may be replaced by an air pipe. Alternatively, the laser device LD and the wave guide WG may be replaced by an infrared (IR) heater and an IR wave guide, respectively. By using such remote heating manner, equipment of the heater HT (e.g., the laser device LD) can be avoided from absorbing induction power designed to heat the electrical connectors EC1, EC2 of the package components PC1, PC2. Those skilled in the art may select a proper heater according to process requirements, the present disclosure is not limited thereto. In addition, in some embodiments, at least one of the first and second holders 102, 106 may be configured to locally heat the corresponding package component(s). For instance, a portion of the second package component PC2 to be bonded with the first package component PC1 (e.g., one of the die regions of the device wafer) may be locally heated by the second holder 106. Alternatively, substantially the entire first package component PC1 and/or the second package component PC2 may be globally heated by the first and second holders 102, 106. Furthermore, in some embodiments, a heating temperature for bonding the dielectric layers DL1, DL2 may be lower than a heating temperature for bonding the electrical connectors EC1, EC2, and may not cause thermal damages on the interconnection structures and/or elements in the active devices in the first and second package components PC1, PC2. For instance, the heating temperature for bonding the dielectric layers DL1, DL2 may range from 150° C. to 250° C., whereas the heating temperature for bonding the electrical connectors EC1, EC2 may range from 180° C. to 350° C.

Figure 1B:
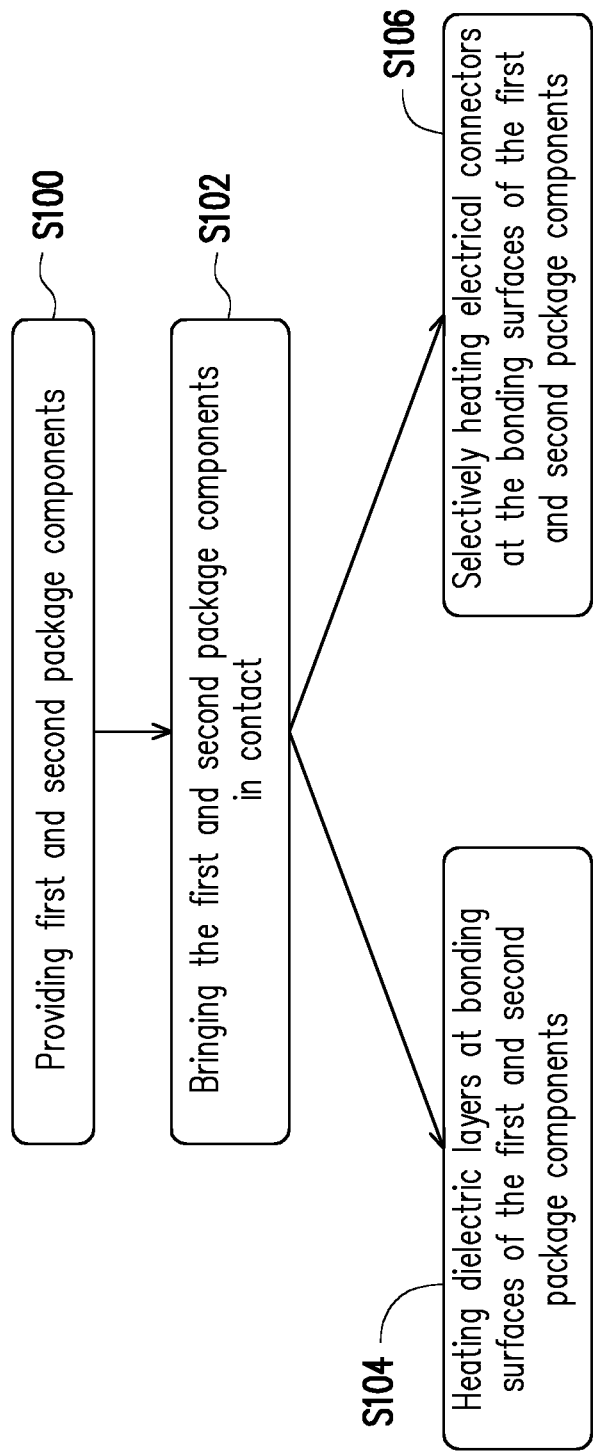
FIG. 1B is a flow diagram illustrating a bonding method of package components according to some embodiments of the present disclosure.

FIG. 1B is a flow diagram illustrating a bonding method of the first and second package components PC1, PC2 according to some embodiments of the present disclosure. The bonding method of the first and second package components PC1, PC2 includes the following steps.

Referring to FIG. 1A and FIG. 1B, step S100 is performed, and the first and second package components PC1, PC2 are provided. In some embodiments, before the package components PC1, PC2 are subjected to the following process, bonding surfaces of the package components PC1, PC2 may be cleaned by using acid solution and/or plasma treatment. Subsequently, step S102 is performed, and the first and second package components PC1, PC2 are brought in contact. In those embodiments where the first package component PC1 is a semiconductor chip, the first package component PC1 may be provided by performing a singulation process on a device wafer, and may be held by the first holder 102. On the other hand, the second package component PC2, such as a device wafer or an interposer wafer, is held by the second holder 106 and placed on the stage 108. Thereafter, the first package component PC1 held by the first holder 102 is aligned with a portion of the second package component PC2 (e.g., one of the die regions defined by the trench TR) to be bonded with the first package component PC1, then approximates and contacts this portion of the second package component PC2 during the step S102. In addition, the first package component PC1 may be further pressed against the second package component PC2 by the bonding head 104. In some embodiments, the first package component PC1 is to be bonded with the second package component PC2 through a hybrid bonding manner. In these embodiments, the dielectric layer DL1 at the bonding surface of the first package component PC1 is brought in contact with a portion of the dielectric layer DL2 at the bonding surface of the second package component PC2, whereas the electrical connectors EC1 at the bonding surface of the first package component PC1 may approximate some of the electrical connectors EC2 at the bonding surface of the second package component PC2, but may be slightly spaced apart from these electrical connectors EC2. Furthermore, in some embodiments, the first and second package components PC1, PC2 are preliminarily bonded with each other after the step S102.

In some embodiments, step S104 is performed, and the dielectric layers DL1, DL2 at the bonding surfaces of the first and second package components PC1, PC2 are heated, so as to be bonded together. In some embodiments, the dielectric layers DL1, DL2 are heated through the first and second holders 102, 106. In certain cases, the second package component PC2 to be bonded with the first package component PC1 is locally heated. Alternatively, the entire second package component is heated. Similarly, substantially the entire first package component PC1 or a portion of the first package component PC1 can be heated through the first holder 102. In some embodiments, a heating temperature for bonding the dielectric layers DL1, DL2 ranges from 150° C. to 250° C., and a heating time for bonding the dielectric layers DL1, DL2 ranges from 20 minutes to 120 minutes. However, those skilled in the art may adjust the heating temperature and the heating time according to materials of the dielectric layers DL1, DL2 and process requirements, the present disclosure is not limited thereto.

Furthermore, step S106 is performed, and the electrical connectors EC1, EC2 at the bonding surfaces of the first and second package components PC1, PC2 are selectively heated by the induction heating system 110. In some embodiments, the electrical connectors EC1, EC2 are selectively heated by the induction coil 112 of the induction heating system 110. In addition, the selective heating may be dynamically controlled by using the controller 114, the temperature sensor 116 and the comparator 118 of the induction heating system 110. During the selective heating, the electrical connectors EC1, EC2, which may be previously spaced apart from each other, may expand and in contact with each other. As such, the electrical connectors EC1, EC2 could be bonded together. In some embodiments, the first package component PC1 is pressed against the second package component PC2 by the bonding head 104, and the heating on the dielectric layers DL1, DL2 and the selective heating on the electrical connectors EC1, EC2 can be performed simultaneously. In these embodiments, the steps S104 and S106 are at least partially overlapped. In alternative embodiments, the first package component PC1 is not pressed by the bonding head 104, but simply placed on the second package component PC2. In these alternative embodiments, the bonding head 104 may be omitted, and the selective heating of the electrical connectors EC1, EC2 may be performed after the bonding of the dielectric layers DL1, DL2 has been completed. That is, in these alternative embodiments, the step S104 is followed by the step S106. A heating temperature of the electrical connectors EC1, EC2 may range from 180° C. to 350° C., and a heating time of the electrical connectors EC1, EC2 may range from 20 minutes to 120 minutes. In addition, the frequency of the alternating current input to the induction coil 112 may range from 300 kHZ to 300 GHz. In those embodiments where the alternating current is input to the induction coil 112 by pulse mode, on/off power ratio and peak current value can be controlled, and each current pulse may have sub-pulses with different frequencies. However, those skilled in the art may adjust the heating temperature, the heating time along with other heating parameters according to dimensions and materials of the electrical connectors EC1, EC2 as well as other process requirements, the present disclosure is not limited thereto. Furthermore, it should be noted that, as a result of the selective heating, elements in the first and second package components EC1, EC2 except for the electrical connectors EC1, EC2 may be kept at a relatively low temperature (e.g., not greater than about 200° C.) during the step S106.

Although only a single first package component PC1 is depicted as being bonded onto the second package component PC2, one or more first package component(s) PC1 may actually be held by the first holder 102, and bonded onto the second package component PC2. In those embodiments where multiple first package components PC1 are transferred onto the second package component PC2, these first package components PC1 may be identical to one another, or at least two of these first package components PC1 are different from each other. Moreover, after completion of the bonding process, the bonded structure may be subjected to subsequent packaging process including, for example, a singulation process, a molding process, a redistribution layer formation process or the like.

Figure 2:
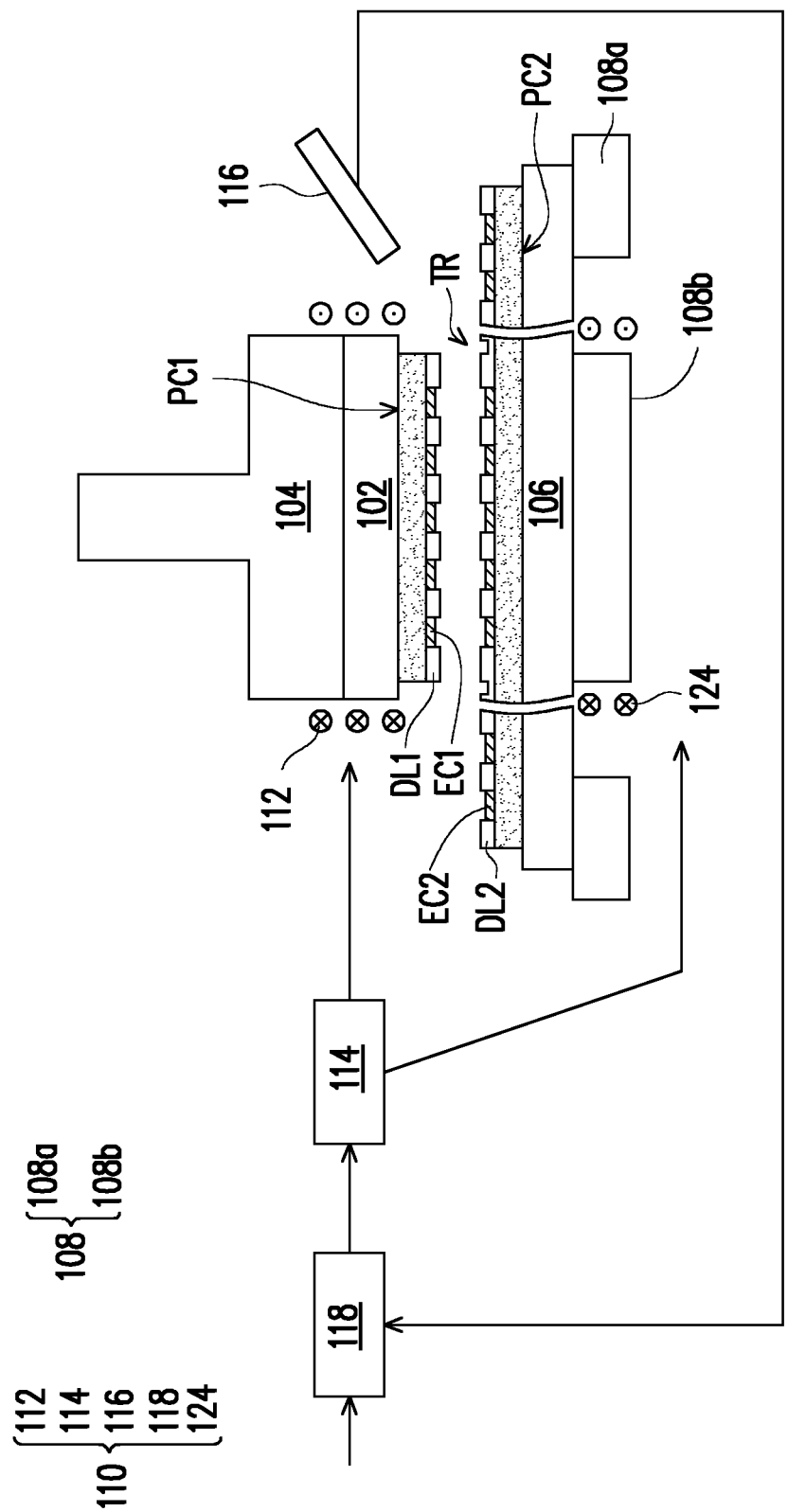
FIGS. 2-7 are schematic diagrams illustrating bonding apparatuses according to some embodiments of the present disclosure.

FIG. 2 is a schematic diagram illustrating a bonding apparatus 100a according to some embodiments of the present disclosure. The bonding apparatus 100a shown in FIG. 2 and a bonding method using the bonding apparatus 100a are similar to the bonding apparatus 100 and the bonding method using the bonding apparatus 100 as described with reference to FIG. 1A. Only differences therebetween will be discussed, the like or the same parts would not be repeated again. In addition, the heater HT are omitted from FIG. 2 for conciseness.

Referring to FIG. 2, in some embodiments, the stage 108 is provided as having a frame portion 108a and a plate portion 108b surrounded by and connected to the frame portion 108a, and the bonding apparatus 100a further includes an additional induction coil 124 winding around the plate portion 108b of the stage 108. The plate portion 108b may be positioned under a portion of the second package component PC2 to be bonded with the first package component PC1, such that the selective heating on the electrical connectors EC2 in this portion of the second package component PC2 can be enhanced by the additional induction coil 124. In some embodiments, the second holder 106 is movable with respect to the stage 108. In addition, the additional induction coil 124 may receive the alternating current, which is also provided to the induction coil 112, by the controller 114. Those skilled in the art may adjust dimensions of the plate portion 108b of the stage 108 according to dimensions of the portion of the second package component PC2 to be bonded with the first package component(s) PC1, the present disclosure is not limited thereto. Moreover, those skilled in the art may adjust a number of windings and a number of layer(s) of the additional induction coil 124 as well as a vertical position of the additional induction coil 124 according to process requirements, the present disclosure is not limited thereto as well.

Regarding the bonding method using the bonding apparatus 100a, in some embodiments, the package component PC2 is locally heated by the heater HT (not shown in FIG. 2) during step S104, such that a portion of the package component PC2 to be bonded with the first package component PC1 (e.g., a die region of the package component PC2) can be heated without thermally damaging other portions of the second package component PC2. Furthermore, in some embodiments, the induction coil 112 and the additional induction coil 124 are both used for selectively heating the electrical connectors EC1 of the first package component PC1 and at least some of the electrical connectors EC2 of the second package component PC2 during the step S106 as described with reference to FIG. 1B.

Figure 3:
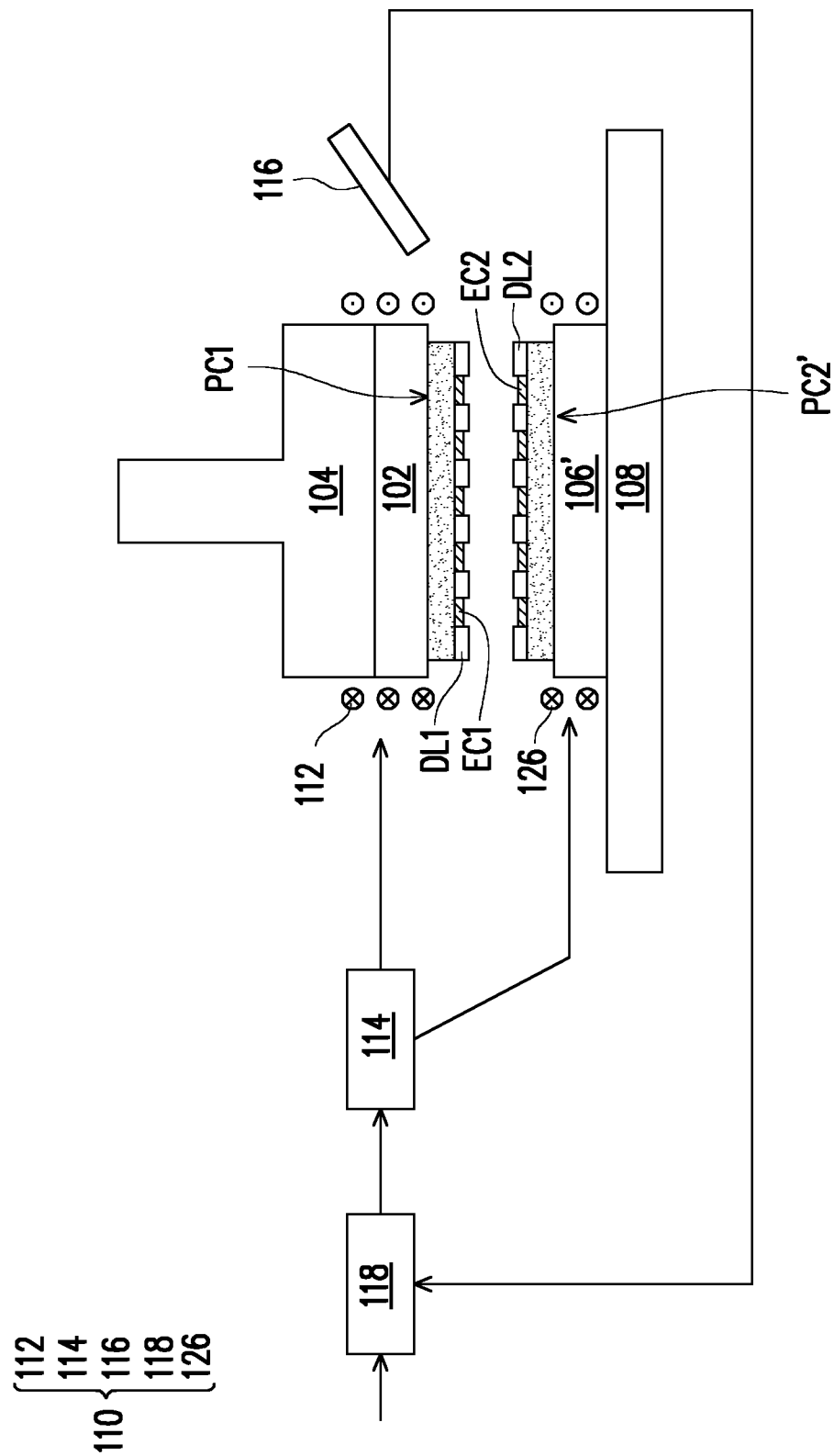

FIG. 3 is a schematic diagram illustrating a bonding apparatus 100b according to some embodiments of the present disclosure. The bonding apparatus 100b shown in FIG. 3 and a bonding method using the bonding apparatus 100b are similar to the bonding apparatus 100 and the bonding method using the bonding apparatus 100 as described with reference to FIG. 1A. Only differences therebetween will be discussed, the like or the same parts would not be repeated again. In addition, the heater HT are omitted from FIG. 3 for conciseness.

Referring to FIG. 3, in some embodiments, a second package component PC2' is a semiconductor chip similar to the first package component PC1 as described with reference to FIG. 1A, and is held by a second holder 106'. The first holder 102 is configured to hold the first package component PC1 and be controlled for placing the first package component PC1 onto the second package component PC2' (during the step S102), then the first and second package components PC1, PC2' are bonded with each other. In this way, a chip to chip (C2C) bonding can be realized. In these embodiments, the second holder 106' may have dimensions smaller than the dimensions of the second holder 106 (as shown in FIG. 1A) configured to hold a device wafer or an interposer wafer. In those embodiments where the bonding apparatus 100b is configured to perform a hybrid bonding process, the dielectric layers DL1, DL2 at the bonding surfaces of the first and second semiconductors PC1, PC2' are brought in contact (during the step S102), and heated for being bonded together (during the step S104) by, for example, the heater HT as described with reference to FIG. 1A. In addition, the electrical connectors EC1, EC2 at the bonding surfaces of the first and second package components PC1, PC2' may be brought close to or in contact with each other (during the step S102), and then selectively heated for being bonded together (during the step S106) by the induction heating system 110.

In some embodiments, the bonding apparatus 100b further includes an additional induction coil 126. The induction coil 126 is wound around the second holder 106', and configured to enhance the selective heating of the electrical connectors EC1, EC2 of the first and second package components PC1, PC2'. In these embodiments, the additional induction coil 126 may receive the alternating current, which is also provided to the induction coil 112, by the controller 114. In addition, those skilled in the art may adjust a number of windings and a number of layer(s) of the additional induction coil 126 according to process requirements, the present disclosure is not limited thereto. Alternatively, the induction coil 126 may be omitted from the bonding apparatus 100b.

Figure 4:
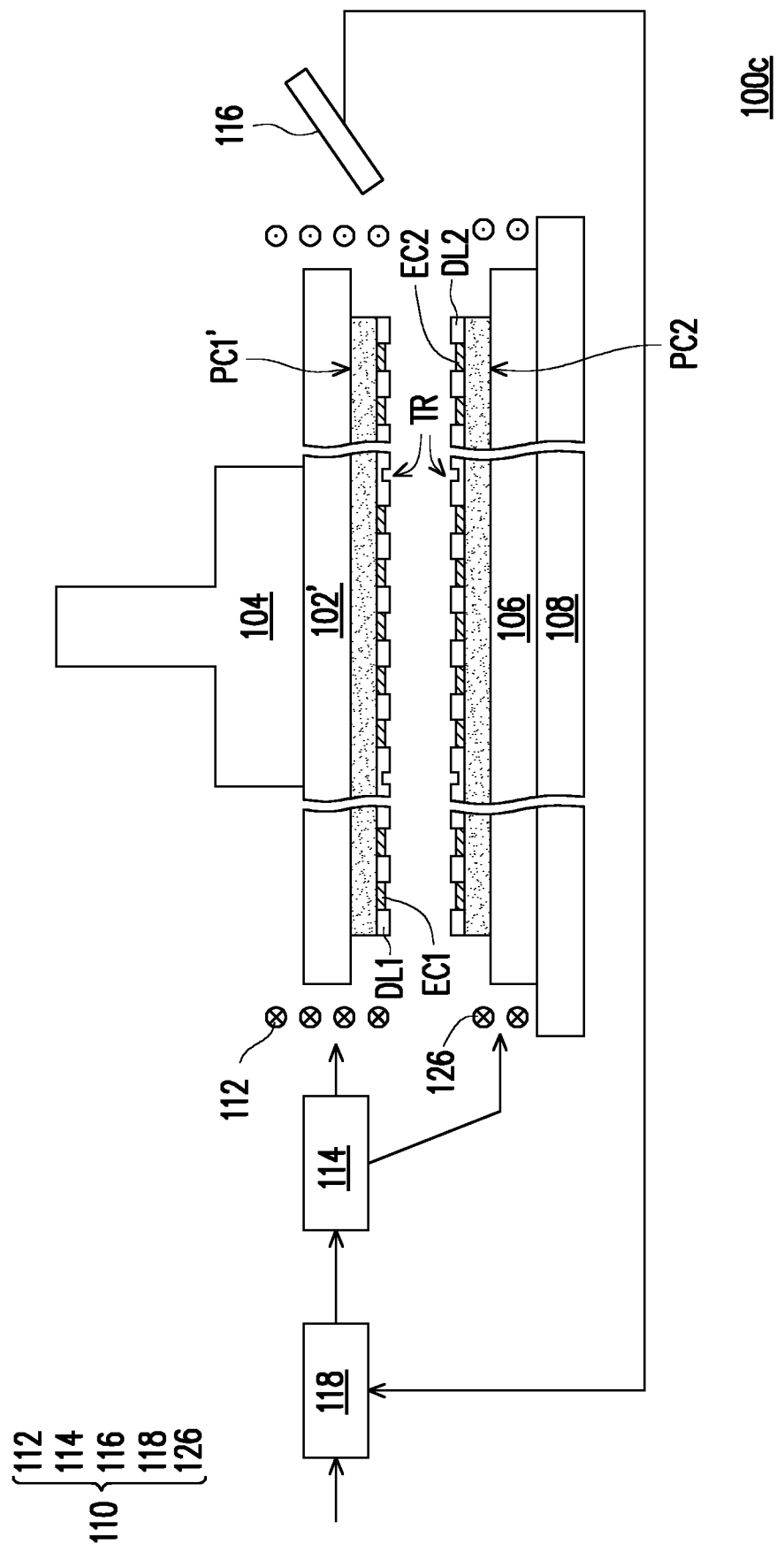

FIG. 4 is a schematic diagram illustrating a bonding apparatus 100c according to some embodiments of the present disclosure. The bonding apparatus 100c shown in FIG. 4 and a bonding method using the bonding apparatus 100c are similar to the bonding apparatus 100 and the bonding method using the bonding apparatus 100 as described with reference to FIG. 1A. Only differences therebetween will be discussed, the like or the same parts would not be repeated again. In addition, the heater HT are omitted from FIG. 4 for conciseness.

Referring to FIG. 4, in some embodiments, a first package component PC1' is a device wafer similar to the second package component PC2 as described with reference to FIG. 1A, and held by a first holder 102'. Alternatively, the first package component PC1' is an interposer wafer, which may be free of active devices (e.g., transistors), and may not have the die regions. The first holder 102' is configured to hold the first package component PC1' and be controlled for placing the first package component PC1' onto the second package component PC2 (during the step S102), then the first and second package components PC1', PC2 are bonded with each other. In this way, a wafer to wafer (W2 W) bonding can be realized. In these embodiments, the first holder 102' may have dimensions greater than the dimensions of the first holder 102 (as shown in FIG. 1A) configured to hold a semiconductor chip. In those embodiments where the bonding apparatus 100c is configured to perform a hybrid bonding process, the dielectric layers DL1, DL2 at the bonding surfaces of the first and second semiconductors PC1', PC2 are brought in contact (during the step S102) with the trenches TR of the package components PC1', PC2 aligned with each other, and heated for being bonded together (during the step S104) by, for example, the heater HT as described with reference to FIG. 1A. In addition, the electrical connectors EC1, EC2 at the bonding surfaces of the first and second package components PC1', PC2 may be brought close to or in contact with each other (during the step S102), and then selectively heated for being bonded together (during the step S106).

In some embodiments, the bonding apparatus 100c further includes the additional induction coil 126 as described with reference to FIG. 3. The additional induction coil 126 is wound around the second holder 106, and contributes to the selective heating of the electrical connectors EC1, EC2. Alternatively, the induction coil 126 may be omitted from the bonding apparatus 100c.

Figure 5:
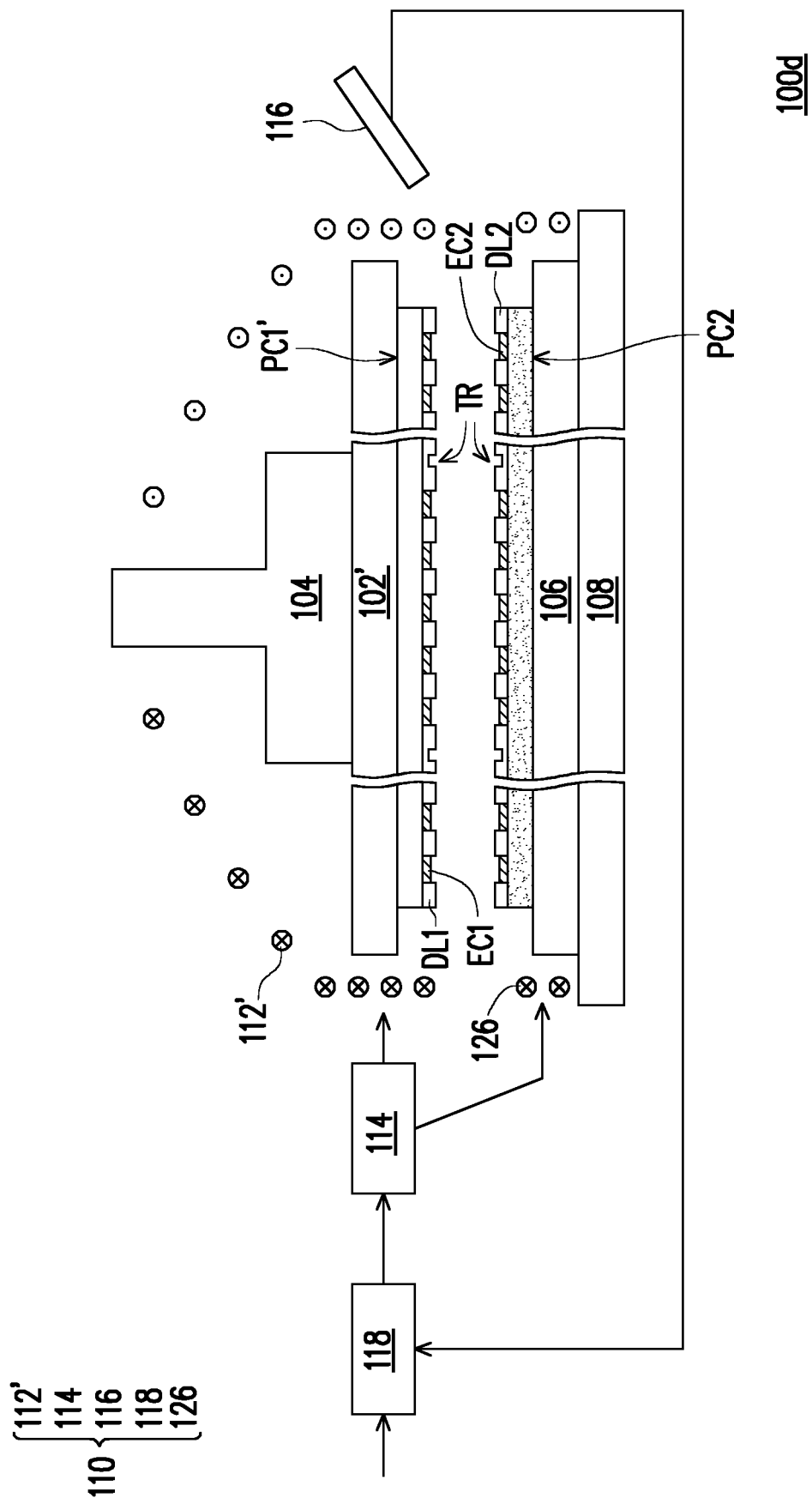

FIG. 5 is a schematic diagram illustrating a bonding apparatus 100d according to some embodiments of the present disclosure. The bonding apparatus 100d shown in FIG. 5 and a bonding method using the bonding apparatus 100d are similar to the bonding apparatus 100c and the bonding method using the bonding apparatus 100c as described with reference to FIG. 4. Only differences therebetween will be discussed, the like or the same parts would not be repeated again. In addition, the heater HT are omitted from FIG. 5 for conciseness.

Referring to FIG. 4 and FIG. 5, an induction coil 112' shown in FIG. 5 is similar to the induction coil 112 as shown in FIG. 4, except that the induction coil 112' shown in FIG. 5 is further coiled over the first package component PC1'. That is, the first package component PC1' is overlapped with a top portion of the induction coil 112' along a vertical direction. In this way, the selective heating of some of the electrical connectors EC1, EC2 in central regions of the first and second package components PC1', PC2 can be enhanced. Therefore, a uniformity of the selective heating of the electrical connectors EC1, EC2 of the first and second package components PC1', PC2 can be improved. In some embodiments, the top portion of the induction coil 112' may have a radius gradually decreasing away from the first holder 102', whereas the remainder portion of the induction coil 112' may have a substantially fixed radius. Those skilled in the art may adjust a number of windings and a number of layer(s) of the induction coil 112' according to process requirements, the present disclosure is not limited thereto.

In addition, the induction coil 112 as shown in FIG. 1A, FIG. 2 and FIG. 3 may be alternatively modified to resemble the induction coil 112' as shown in FIG. 5. In these alternative embodiments, the first package component PC1 is overlapped with a top portion of the modified induction coil 112 (as similar to the induction coil 112' shown in FIG. 5), and a uniformity of the selective heating on the electrical connectors EC1, EC2 can be improved.

In addition, the bonding head 104 may be alternatively omitted from the bonding apparatuses 100a-100d as shown in FIGS. 2-5. In those embodiments where a hybrid bonding process is performed, the heating of the dielectric layers DL1, DL2 and the selective heating of the electrical connectors EC1, EC2 can be performed simultaneously when the bonding head 104 is included in the corresponding bonding apparatus. On the other hand, when the bonding head 104 is omitted from the corresponding bonding apparatus, the selective heating of the electrical connectors EC1, EC2 should be performed after the dielectric layers DL1, DL2 have been bonded together.

Figure 6:
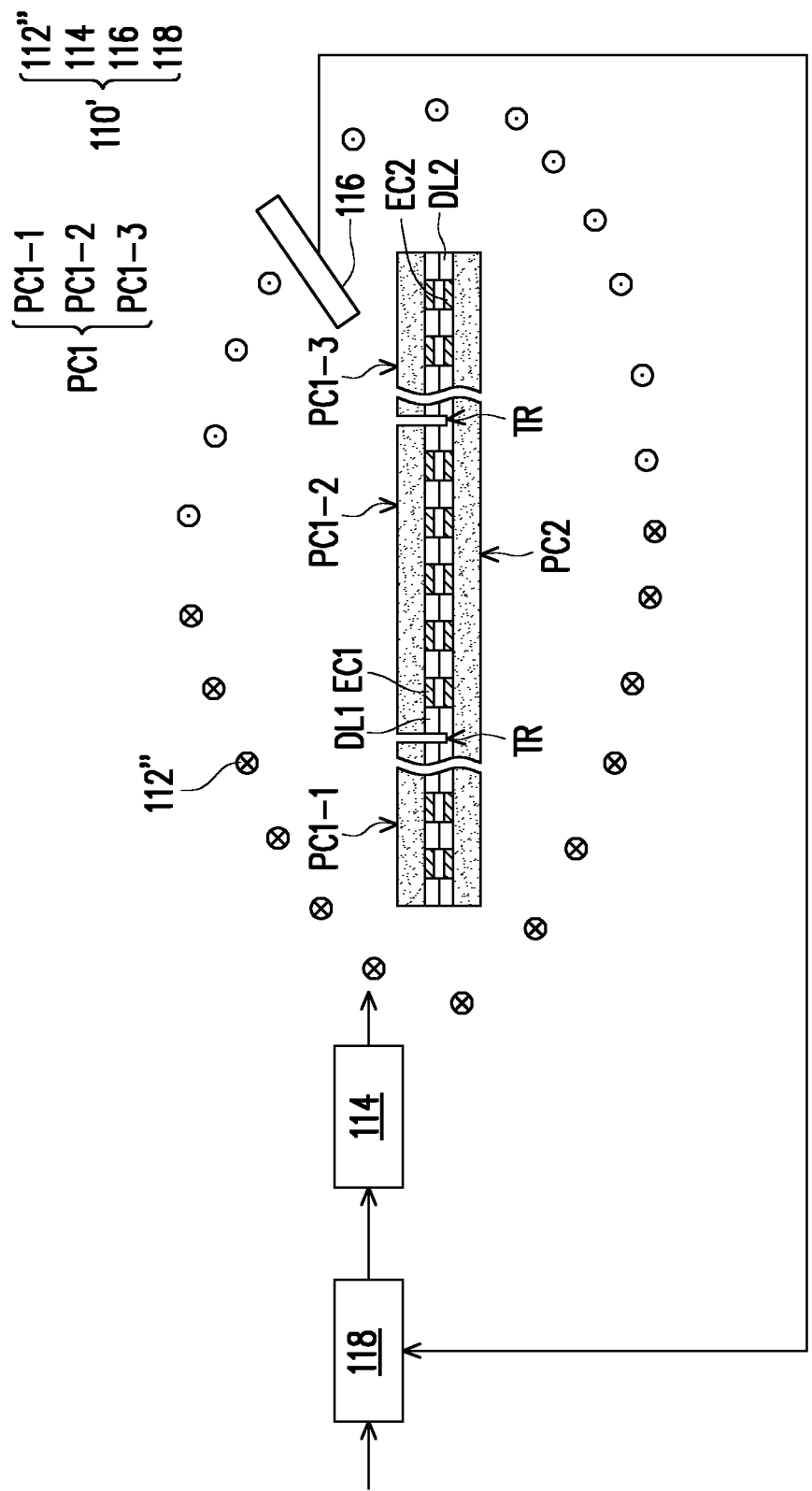

FIG. 6 is a schematic diagram illustrating a bonding apparatus 100' according to some embodiments of the present disclosure. The bonding apparatus 100' shown in FIG. 6 and a bonding method using the bonding apparatus 100' are similar to the bonding apparatus 100 and the bonding method using the bonding apparatus 100 as described with reference to FIG. 1A. Only differences therebetween will be discussed, the like or the same parts would not be repeated again.

Referring to FIG. 1A and FIG. 6, the induction heating system 110 including the induction coil 112 as shown in FIG. 1A is replaced by an induction heating system 110' including an induction coil 112" as shown in FIG. 6. At first, a plurality of the first package components PC1 (e.g., first package components PC1-1, PC1-2, PC1-3) are brought in contact with the second package component PC2 (i.e., the step S102 as shown in FIG. 1B). The attached first package components PC1 are laterally separated from one another, and may be aligned with the die regions defined by the trench TR of the second package component PC2. Subsequently, the dielectric layers DL1, DL2 of the first and second package components PC1, PC2 may be bonded together by a heat treatment (i.e., the step S104 as shown in FIG. 1B), and the bonded first and second package components PC1, PC2 are moved into an area surrounded by the induction coil 112". Thereafter, the electrical connectors EC1, EC2 of the first and second package components PC1, PC2 are selectively heated by using the induction coil 112" (i.e., the step S106 as shown in FIG. 1B), and the selective heating can be dynamically controlled by the controller 114, temperature sensor 116 and comparator 118 connected to the induction coil 112". In some embodiments, the induction coil 112" is winding around an insulating support (not shown). In addition, those skilled in the art may adjust a number of windings and a number of layer(s) of the induction coil 112" according to process requirements, the present disclosure is not limited thereto.

As shown in FIG. 6, each of the first package components PC1 is a semiconductor chip, and the second package component PC2 is depicted as a device wafer or an interposer wafer. In other words, a chip to wafer (C2W) bonding process including a selective heating by using the induction heating system 110' is performed. However, in other embodiments, the induction heating system 110' is also available for performing a chip to chip (C2C) bonding process or a wafer to wafer (W2W) bonding process.

Figure 7:
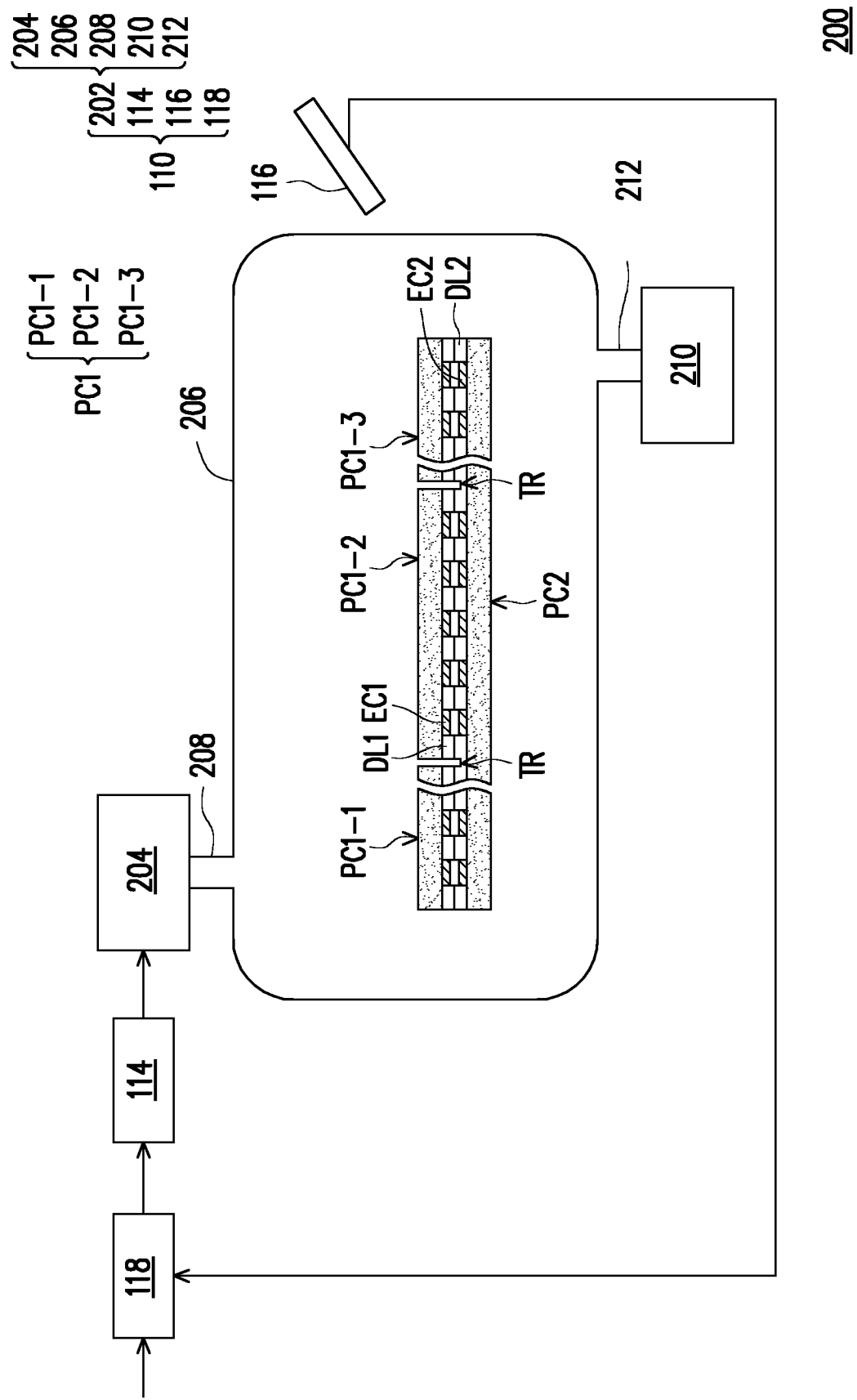

FIG. 7 is a schematic diagram illustrating a bonding apparatus 200 according to some embodiments of the present disclosure. The bonding apparatus 200 shown in FIG. 7 and a bonding method using the bonding apparatus 200 are similar to the bonding apparatus 100 and the bonding method using the bonding apparatus 100 as described with reference to FIG. 1A. Only differences therebetween will be discussed, the like or the same parts would not be repeated again.

Referring to FIG. 1A and FIG. 7, the induction coil 112 (as shown in FIG. 1A) of the induction heating system 110 is replaced by an electromagnetic wave generation module 202 (as shown in FIG. 7). The electromagnetic wave generation module 202 includes an electromagnetic wave generator 204, such as a microwave generator. The electromagnetic wave generator 204 is configured to generate electromagnetic wave (e.g., microwave, from 300M Hz to 300G Hz) for selectively heating the electrical connectors EC1, EC2 of the first and second package components PC1, PC2. In some embodiments, the electromagnetic wave generation module 202 further includes a housing 206. At first, a plurality of the first package components PC1 (e.g., first package components PC1-1, PC1-2, PC1-3) are brought in contact with the second package component PC2. The first package components PC1 are laterally separated from one another, and may be aligned with the die regions defined by the trench TR of the second package component PC2. Subsequently, the dielectric layers DL1, DL2 of the first and second package components PC1, PC2 may be bonded together by a heat treatment performed, and the bonded first and second package components PC1, PC2 are moved into the housing 206. Thereafter, the electrical connectors EC1, EC2 of the first and second package components PC1, PC2 are selectively heated by the electromagnetic wave provided from the electromagnetic wave generator 204, in order to be bonded together. In some embodiments, the electromagnetic wave generated by the electromagnetic wave generator 204 may be provided into the housing through, for example, a wave guide 208. In addition, the housing 206 is configured to block the electromagnetic wave from entering surrounding area. In some embodiments, an input current of the electromagnetic wave generator 204 is provided by the controller 114, and the selective heating of the electrical connectors EC1, EC2 may be dynamically controlled by using the controller 114, the temperature sensor 116 and the comparator 118 as described with reference to FIG. 1A. In some embodiments, the temperature sensor 116 is placed outside the housing 206 (as shown in FIG. 7), and configured to detect a temperature in the housing 206 through a view port (not shown). In addition, the controller 114 and the comparator 118 may also be placed outside the housing 206. Those skilled in the art may change locations of the temperature sensor 116, the controller 114 and the comparator 118 according to process requirements, the present disclosure is not limited thereto.

In some embodiments, the electromagnetic wave generation module 202 further includes an electromagnetic wave absorption tank 210. The electromagnetic wave absorption tank 210 is connected to the housing 206 through, for example, a waveguide 212, and is configured to absorb excessive electromagnetic wave from the chamber of the housing 206. The electromagnetic wave generator 204 and the electromagnetic wave absorption tank 210 may be located at opposite sides of the housing 206. For instance, the electromagnetic wave generator 204 and the electromagnetic wave absorption tank 210 may be disposed at top and bottom sides of the housing 206, and the selective heating on the electrical connectors EC1, EC2 of the first and second package components PC1, PC2 may be performed in an area between the electromagnetic wave generator 204 and the electromagnetic wave absorption tank 210. In this way, the electromagnetic wave not being absorbed by the first and second package components PC1, PC2 can be at least partially collected by the electromagnetic wave absorption tank 210. In some embodiments, electromagnetic wave absorption medium is contained in the electromagnetic wave absorption tank 210. For instance, the wave absorption medium may include water.

As shown in FIG. 7, each of the first package components PC1 is a semiconductor chip, and the second package component PC2 is depicted as a device wafer or an interposer wafer. In other words, a chip to wafer (C2W) bonding process including a selective heating by using the electromagnetic wave generation module 202 is performed. However, in other embodiments, the electromagnetic wave generation module 202 is also available for performing a chip to chip (C2C) bonding process or a wafer to wafer (W2 W) bonding process.

Figure 8:
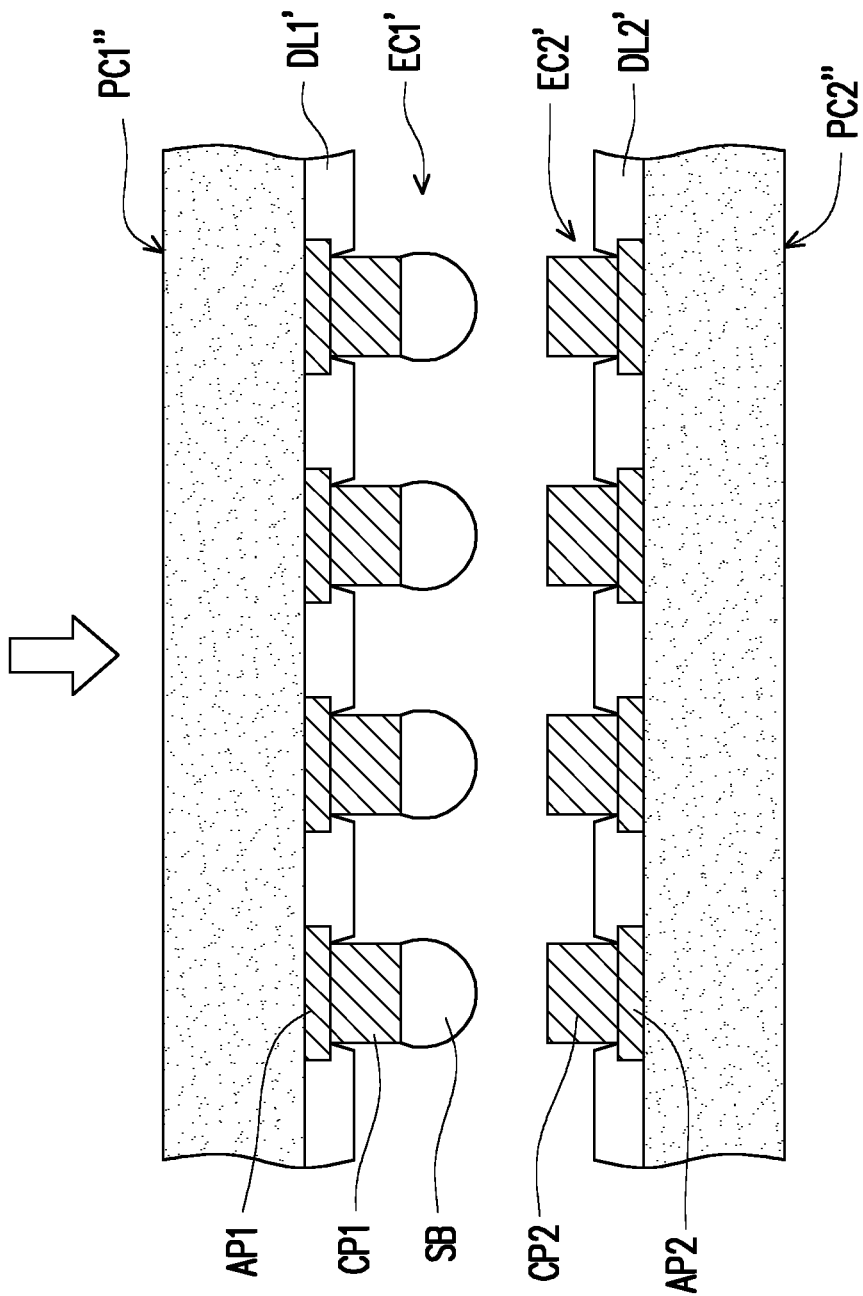
FIG. 8 is a schematic diagram illustrating bonding of package components by using the bonding apparatus according various embodiments of the present disclosure.

FIG. 8 is a schematic diagram illustrating bonding of package components by using the bonding apparatus according various embodiments of the present disclosure.

Referring to FIG. 8, in some embodiments, the bonding apparatuses 100, 100a-100d, 100' 200 as described with reference to FIG. 1A and FIGS. 2-7 may be used for performing an alternative type of bonding process. This alternative type of bonding process may not include bonding of dielectric layers. Accordingly, the step S104 as shown in FIG. 1B may be omitted. To be more specific, electrical connectors EC1' at a bonding surface of a first package component PC1" are bonded with electrical connectors EC2' at a bonding surface of a second package component PC2", whereas a dielectric layer DL1' at the bonding surface of the first package component PC1" may not be bonded with a dielectric layer DL2' at the bonding surface of the second package component PC2". The first package component PC1" may be a semiconductor chip, a semiconductor wafer (e.g., a device wafer or an interposer wafer) or a packaged structure, whereas the second package component PC2" may be a semiconductor chip, a semiconductor wafer, a packaged structure or a package substrate (e.g., a printed circuit board). In some embodiments, the electrical connectors EC1' respectively include a conductive pad AP1, a conductive pillar CP1 and a solder bump SB. The dielectric layer DL1' covering the conductive pads AP1 may have openings respectively overlapped with at least a portion of one of the conductive pads AP1, and the conductive pillars CP1 stand in these openings and electrically connected to the conductive pads AP1. An under bump metallization (UBM) layer (not shown) may be disposed between each conductive pillar CP1 and the corresponding conductive pad AP1. The solder bumps SB may be disposed at surfaces of the conductive pillars CP1 facing away from the conductive pads AP1, and electrically connected to the conductive pillars CP1. In this way, the conductive pillars CP1 and the solder bumps SB may be protruded from the dielectric layer DL1', whereas the conductive pads AP1 are covered by the dielectric layer DL1', the conductive pillars CP1 and the solder bumps SB. On the other hand, the electrical connectors EC2' may respectively include a conductive pad AP2 and a conductive pillar CP2. Configuration of the dielectric layer DL2', the conductive pads AP2 and the conductive pillars CP2 may be similar to the configuration of the dielectric layer DL1, the conductive pads AP1 and the conductive pillars CP1 as described above. In addition, each electrical connector EC2' may as well include an UBM layer (not shown) disposed between the conductive pillar CP1 and the conductive pad AP2.

In other embodiments, the solder bumps SB are included in the electrical connectors EC2', rather than being included in the electrical connectors EC1'. In these embodiments, the solder bumps SB are disposed on surfaces of the conductive pillars CP2 facing away from the conductive pads AP2. The electrical connectors having the conductive pillars CP1/CP2 and the solder bumps SB may be regarded as pillar bumps or micro-bumps, and may respectively have a dimension (e.g., width) ranging from 10 µm to 20 µm. In yet other embodiments, the conductive pillars CP1, CP2 may be omitted from the electrical connectors EC1', EC2', and the solder bumps SB may be provided in the openings of the dielectric layer DL1' or the dielectric layer DL2'. In these embodiments, the solder bumps SB may be regarded as ball grid array (BGA) or controlled collapse chip connection (C4) bumps, and may respectively have a dimension (e.g., width) ranging from 20 µm to 200 µm.

During the alternative bonding method by using the bonding apparatuses 100, 100a-100d, 100', 200 as described with reference to FIG. 1A and FIGS. 2-7, the electrical connectors EC1', EC2' are brought in contact in step S102 as shown in FIG. 1B, while the dielectric layers DL1', DL2' are spaced apart from each other. When the electrical connectors EC1' are in contact with the electrical connectors EC2', the solder bumps SB are connected between the conductive pillars CP1 and the conductive pillars CP2, respectively. Afterwards, the electrical connectors EC1', EC2' are selectively heated by using the induction heating system 110 of the bonding apparatuses 100, 100a-100d, 100', 200 as described with reference to FIG. 1A and FIGS. 2-7 in step S106 shown in FIG. 1B. During the selective heating of the electrical connectors EC1', EC2', the solder bumps SB may reflow to form solder joints in desired shape. As such, the first and second package components PC1", PC2" can be bonded together through the electrical connectors EC1', EC2'. In some embodiments, an underfill (not shown) may be provided in a space between the dielectric layers DL1', DL2', such that the electrical connectors EC1', EC2' are laterally surrounded by this underfill.

Figure 9A:
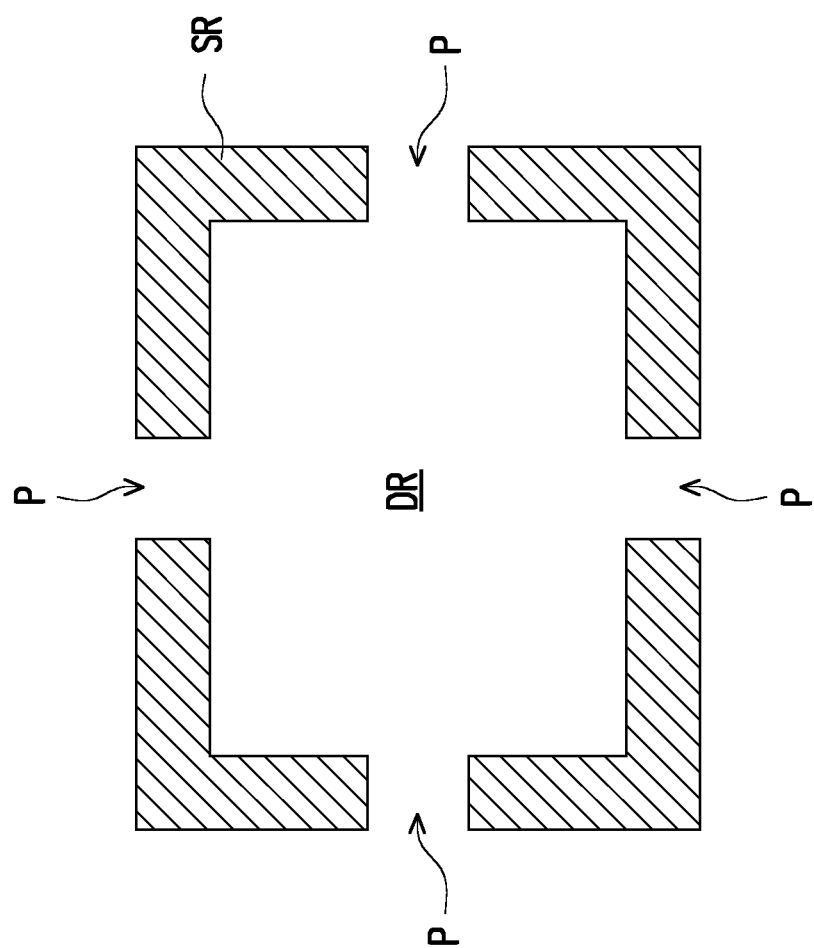
FIG. 9A and FIG. 9B are schematic top views respectively illustrating a seal ring in a package component to be bonded with another package component by using the bonding apparatus according to various embodiments of the present disclosure.

FIG. 9A is a schematic top view illustrating a seal ring SR in a package component to be bonded with another package component by using the bonding apparatus according to various embodiments of the present disclosure.

Referring to FIG. 9A, in some embodiments, a package component to be bonded to another package component with using the bonding apparatus 100, 100a-100d, 100', 200 as described with reference to FIG. 1A and FIGS. 2-7 is a semiconductor chip, a device wafer or a packaged structure. In these embodiments, the electrical connectors (not shown) at a bonding surface of the package component may be located within one or more die region(s) DR. A seal ring SR may surround the die region DR for absorbing stress produced during a possible singulation process. The seal ring SR may be made of a conductive material, such as Cu, Al, Ti, Ni, W or combinations thereof. In addition, the seal ring SR discontinuously extends around the die region DR, and has one or more openings P each located between adjacent line sections of the seal ring SR. In other words, the seal ring SR may be provided as a broken ring surrounding the die region DR. By providing the seal ring SR as separated line sections, undesired absorption of induction power by the seal ring SR can be further reduced. In some embodiments, the die region DR is in a rectangular shape, and the seal ring SR may have four openings P on four sides of the rectangular die region DR, respectively. However, those skilled in the art may adjust a shape of the die region DR, a shape of the seal ring SR, an amount of the opening(s) P of the seal ring SR and a size of each opening of the seal ring SR according to process requirements, the present disclosure is not limited thereto. Furthermore, more seal rings SR can be formed around the die region DR, and each of these seal rings SR are provided as separated line sections as described above.

Similarly, other electrically conductive elements in the package component having a loop shape (e.g., inductances) may be respectively formed as separated line sections, so as to reduce undesired absorption of induction power.

Figure 9B:
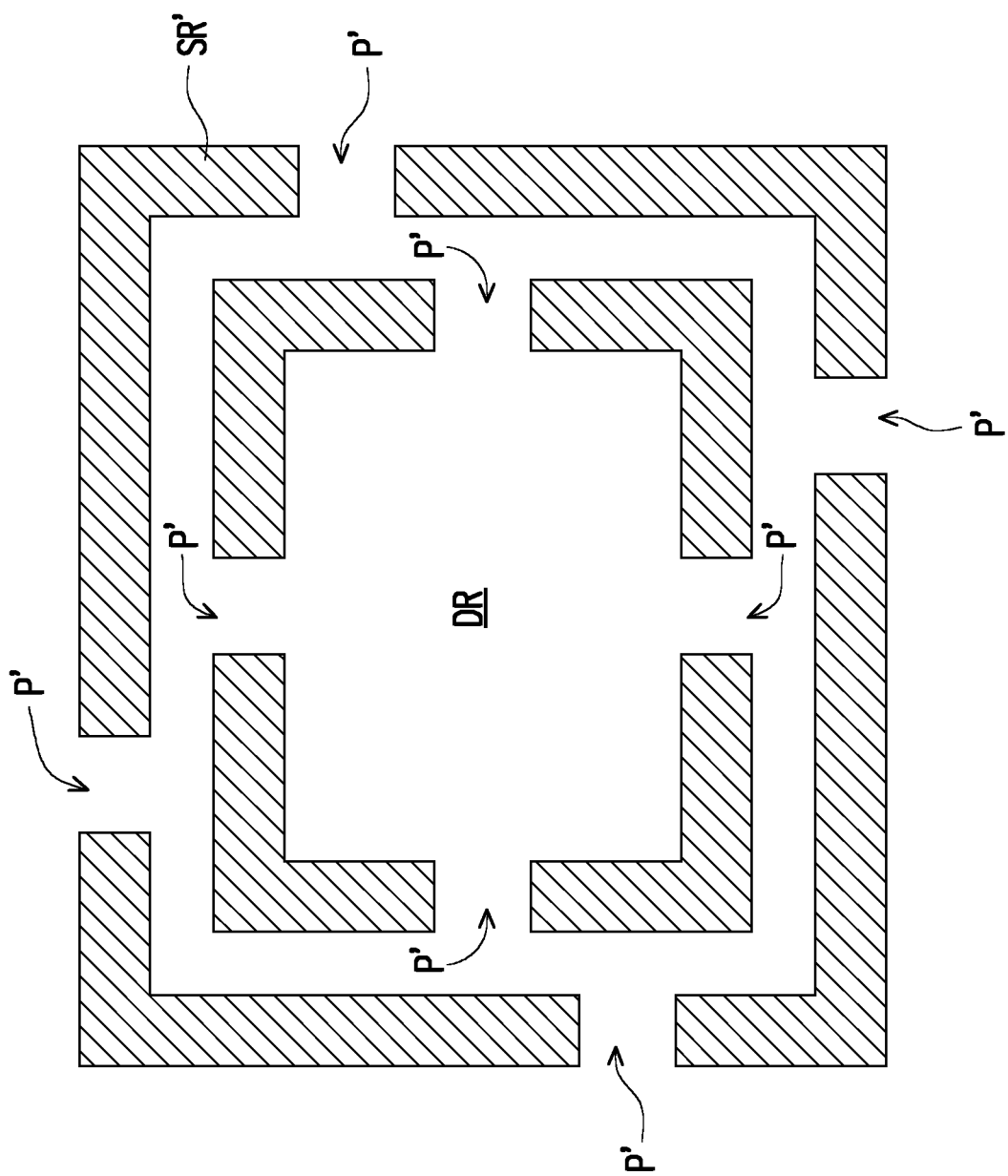

FIG. 9B is a schematic top view illustrating a seal ring SR' in a package component to be bonded with another package component by using the bonding apparatus according to various embodiments of the present disclosure.

The seal ring SR' shown in FIG. 9B is similar to the seal ring SR shown in FIG. 9A, except that the seal ring SR' shown in FIG. 9B includes multiple broken rings (e.g., two broken rings) surrounding the die region DR. Each of the broken rings includes separated line sections, and an opening P' is in between adjacent line sections. In some embodiments, the openings P' of one of the broken ring are offset from the openings P' of another one of the broken rings along a horizontal direction. In these embodiments, the die region DR can be better protected from stress-induced damages during a possible singulation process without resulting in undesired absorption of induction power. Although the seal ring SR' is depicted as having two broken rings, those skilled in the art may form a seal ring having three or more broken rings according to design requirements, the present disclosure is not limited thereto.

As above, the bonding method performed by using various apparatuses according to embodiments of the present disclosure includes selectively heating the electrical connectors of the first and second package components by an electromagnetic induction manner. At a given frequency of the input current for producing the induction heating, electrically conductive elements larger than a critical dimension can be heated, whereas other electrically conductive elements smaller than the critical dimension (such as interconnection structures and/or active devices) may not be heated by the induction heating system. Therefore, by adjusting dimensions of the electrical connectors or the frequency of the input current, the electrical connectors can be selectively heated without damaging other electrically conductive elements smaller than the critical dimension (e.g., interconnections, active devices or the like). Accordingly, a yield of the bonding process can be improved.

In an aspect of the present disclosure, a bonding method of package components is provided. The methods comprises: providing at least one first package component and a second package component, wherein the at least one first package component has first electrical connectors and a first dielectric layer at a bonding surface of the at least one first package component, and the second package component has second electrical connectors and a second dielectric layer at a bonding surface of the second package component; bringing the at least one first package component and the second package component in contact, such that the first electrical connectors approximate or contact the second electrical connectors; and selectively heating the first electrical connectors and the second electrical connectors by electromagnetic induction, in order to bond the first electrical connectors with the second electrical connectors.

In another aspect of the present disclosure, a bonding apparatus is provided. The bonding apparatus comprises: a first holder, configured to hold at least one first package component having first electrical connectors at a bonding surface of the first package component, and to be controlled for placing the first package component onto a second package component having second electrical connectors at a bonding surface of the second package component, such that the first electrical connectors approximate or contact the second electrical connectors; and an induction heating system, comprising an induction coil winding around the first holder and configured to selectively heat the first electrical connectors and the second electrical connectors, in order to bond the first electrical connectors with the second electrical connectors.

In yet another aspect of the present disclosure, a bonding apparatus is provided. The bonding apparatus comprises: an electromagnetic wave generator; and a housing, connected to the electromagnetic wave generator and configured to accommodate at least one first package component and a second package component on which the at least one first package component is placed, wherein first electrical connectors at a bonding surface of the at least one first package component approximate or contact second electrical connectors at a bonding surface of the second package component, the electromagnetic wave generator is configured to provide an electromagnetic wave into the housing for inducing heating of the first electrical connectors and the second electrical connectors, in order to bond the first electrical connectors with the second electrical connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonding method of package components, comprising:
    providing at least one first package component and a second package component, wherein the at least one first package component has first electrical connectors and a first dielectric layer at a bonding surface of the at least one first package component, and the second package component has second electrical connectors and a second dielectric layer at a bonding surface of the second package component;
    bringing the at least one first package component and the second package component in contact, such that the first electrical connectors approximate or contact the second electrical connectors; and
    selectively heating the first electrical connectors and the second electrical connectors by an electromagnetic wave provided by an electromagnetic wave generator, in order to bond the first electrical connectors with the second electrical connectors, wherein the at least one first package component and the second package component are placed in a housing connected to the electromagnetic wave generator during the selectively heating, and an electromagnetic wave absorption tank is connected to the housing for absorbing excessive portions of the electromagnetic wave,
    wherein conductive elements in the at least one first package component and the second package component larger than a critical dimension are targeted by the selective heating, and the first and second connectors are included in the conductive elements larger than the critical dimension,
    wherein conductive elements smaller than the critical dimension as well as insulating elements in the at least one first package component and the second package component are not targeted by the selective heating.

2. The bonding method of the package components according to claim 1, wherein the first dielectric layer and the second dielectric layer are brought in contact during the step of bringing the at least one first package component and the second package component in contact.

3. The bonding method of the package components according to claim 2, further comprising:
    heating the first dielectric layer and the second dielectric layer after the step of bringing the at least one first package component and the second package component in contact, in order to bond the first dielectric layer with the second dielectric layer.

4. The bonding method of the package components according to claim 3, wherein an oven is configured to perform the heating of the first dielectric layer and the second dielectric layer, the at least one first package component and the second package component bonded with each other are moved out of the oven after the first dielectric layer is bonded with the second dielectric layer, and the first electrical connectors and the second electrical connectors are then subjected to the selectively heating after the first package component and the second package component are moved out of the oven.

5. The bonding method of the package components according to claim 3, wherein the at least one first package component comprises a plurality of the first package components, each of the first package components is a semiconductor chip, and the second package component is a device wafer or an interposer.

6. The bonding method of the package components according to claim 1, wherein dimensions of the first and second connectors and/or a frequency of an alternating current provided for generating an inductive heating is/are adjusted to ensure that the first and second connectors are selectively heated.

7. The bonding method of the package components according to claim 1, wherein the at least one package component and the second package component are entirely immersed in an electromagnetic field generated for performing the selective heating.

8. The bonding method of the package components according to claim 1, wherein the selective heating is performed intermittently.

9. The bonding method of the package components according to claim 1, wherein the selective heating is dynamically adjusted based on temperature variation of the at least one first package component and the second package component.

10. The bonding method of the package components according to claim 1, wherein a temperature of the conductive elements larger than the critical dimension is raised to a range between 180° C. to 350° C. during the selective heating.

11. The bonding method of the package components according to claim 10, wherein a temperature of the conductive elements smaller than the critical dimension and the insulating elements during the selective heating is kept at about 200° C. or less.

12. A bonding apparatus, comprising:
an electromagnetic wave generator;
a housing, connected to the electromagnetic wave generator and configured to accommodate at least one first package component and a second package component on which the at least one first package component is placed, wherein first electrical connectors at a bonding surface of the at least one first package component approximate or contact second electrical connectors at a bonding surface of the second package component, the electromagnetic wave generator is configured to provide an electromagnetic wave into the housing for inducing heating of the first electrical connectors and the second electrical connectors, in order to bond the first electrical connectors with the second electrical connectors; and
an electromagnetic wave absorption tank, wherein the electromagnetic wave absorption tank is connected to the housing via an additional wave guide and configured to absorb the electromagnetic wave,
wherein conductive elements in the at least one first package component and the second package component larger than a critical dimension are targeted by the inductive heating, and the first and second connectors are included in the conductive elements larger than the critical dimension, and
wherein conductive elements smaller than the critical dimension as well as insulating elements in the at least one first package component and the second package component are not targeted by the inductive heating.

13. The bonding apparatus according to claim 12, wherein the electromagnetic wave generator is connected to the housing via a wave guide.

14. The bonding apparatus according to claim 12, wherein the electromagnetic wave generator is a microwave generator.

15. A bonding method of package components, comprising:
placing a first package component on a second package component, wherein a first dielectric layer at a bonding surface of the first package component is in contact with a second dielectric layer at a bonding surface of the second package component, and first electrical connectors at the bonding surface of the first package component are aligned with second electrical connectors at the bonding surface of the second package component;
non-selectively heating the first and second package components, such that the first dielectric layer is bonded with the second dielectric layer; and
selectively heating conductive elements in the first and second package components larger than a critical dimension by an electromagnetic wave provided by an electromagnetic wave generator, wherein the first and second electrical connectors are included in the conductive elements larger than the critical dimension, the first electrical connectors are bonded with the second electrical connectors as a result of the selective heating, conductive elements smaller than the critical dimension as well as insulating elements in the first and second package components are not targeted by the selective heating, the first and second package components are placed in a housing connected to the electromagnetic wave generator during the selectively heating, and an electromagnetic wave absorption tank is connected to the housing for absorbing excessive portions of the electromagnetic wave.

16. The bonding method of the package components according to claim 15, wherein the first and second package components are non-selectively heated by laser light, hot air or infrared light.

17. The bonding method of the package components according to claim 15, wherein the first electrical connectors are laterally surrounded by a first seal ring, and the second electrical connectors are laterally surrounded by a second seal ring.

18. The bonding method of the package components according to claim 17, wherein the first seal ring has separate portions arranged along a path laterally enclosing the first electrical connectors, and the second seal ring has separate portions arranged along a path laterally enclosing the second electrical connectors.

19. The bonding method of the package components according to claim 15, wherein the first electrical connectors are laterally surrounded by a first seal ring and a second seal ring at an outer side of the first seal ring, and the second electrical connectors are laterally surrounded by a third seal ring and a fourth seal ring at an outer side of the third seal ring.

20. The bonding method of the package components according to claim 19, wherein the first seal ring, the second seal ring, the third seal ring and the fourth seal ring respectively have separate portions, spacing between the portions of the first seal ring is offset from spacing between the portions of the second seal ring, and spacing between the portions of the third seal ring is offset from spacing between the portions of the fourth seal ring.

* * * * *